(12) United States Patent
Lee et al.

(10) Patent No.: US 9,137,886 B2
(45) Date of Patent: Sep. 15, 2015

(54) PRINTED CIRCUIT BOARD AND METHOD FOR MANUFACTURING THE SAME

(71) Applicant: SAMSUNG ELECTRO-MECHANICS CO., LTD., Suwon (KR)

(72) Inventors: Dong Uk Lee, Chungwon-gun (KR); Tae Seong Kim, Chungwon-gun (KR); Young Gon Kim, Ulsan (KR); Seung Hyun Noh, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 174 days.

(21) Appl. No.: 13/739,330

(22) Filed: Jan. 11, 2013

(65) Prior Publication Data

US 2013/0180766 A1 Jul. 18, 2013

(30) Foreign Application Priority Data

Jan. 13, 2012 (KR) .................. 10-2012-0004406

(51) Int. Cl.
| | |
|---|---|
| *H05K 1/02* | (2006.01) |
| *H05K 3/40* | (2006.01) |
| *H05K 3/34* | (2006.01) |
| *H05K 3/00* | (2006.01) |
| *H05K 1/11* | (2006.01) |

(52) U.S. Cl.
CPC .................. *H05K 1/02* (2013.01); *H05K 1/113* (2013.01); *H05K 3/00* (2013.01); *H05K 3/3452* (2013.01); *H05K 3/3457* (2013.01); *H05K 3/3463* (2013.01); *H05K 3/4007* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/3025* (2013.01); *H05K 3/0097* (2013.01); *H05K 3/4038* (2013.01); *H05K 2201/099* (2013.01); *H05K 2203/041* (2013.01); *H05K 2203/049* (2013.01); *H05K 2203/1536* (2013.01)

(58) Field of Classification Search
CPC ....... H05K 1/111; H05K 1/112; H05K 1/113; H05K 1/114; H05K 1/115; H05K 1/116; H05K 1/117; H05K 3/4007; H05K 3/4015; H05K 3/3457; H05K 3/3463
See application file for complete search history.

(56) References Cited

U.S. PATENT DOCUMENTS

| | | | |
|---|---|---|---|
| 5,977,632 A | 11/1999 | Beddingfield | |
| 8,283,781 B2 * | 10/2012 | Wu et al. | ........... 257/738 |

FOREIGN PATENT DOCUMENTS

| | | |
|---|---|---|
| JP | 2000-138308 | 5/2000 |
| JP | 2002-208657 | 7/2002 |
| KR | 10-2006-0067757 | 6/2006 |

(Continued)

OTHER PUBLICATIONS

Korean Notice of Allowance mailed Sep. 1, 2013 in corresponding Korean Application No. 10-2012-0004406.

(Continued)

*Primary Examiner* — Jeremy C Norris
(74) *Attorney, Agent, or Firm* — NSIP Law

(57) ABSTRACT

The present invention relates to a printed circuit board which includes: a solder pad on which a solder ball is mounted; an insulator formed on the solder pad; and a protrusion formed under the insulator to support the solder ball when mounting the solder ball and can stably mount the solder ball.

20 Claims, 13 Drawing Sheets

(56) References Cited

FOREIGN PATENT DOCUMENTS

| KR | 10-2007-0059996 | 6/2007 |
| KR | 10-2010-0071568 | 6/2010 |
| KR | 10-1077377 | 10/2011 |

OTHER PUBLICATIONS

Korean Office Action issued Apr. 22, 2013 in corresponding Korean Application No. 10-2012-0004406.
Chinese Office Action issued Apr. 16, 2015 in corresponding Chinese Patent Application No. 201310013083.3.

* cited by examiner

[FIG. 19B]
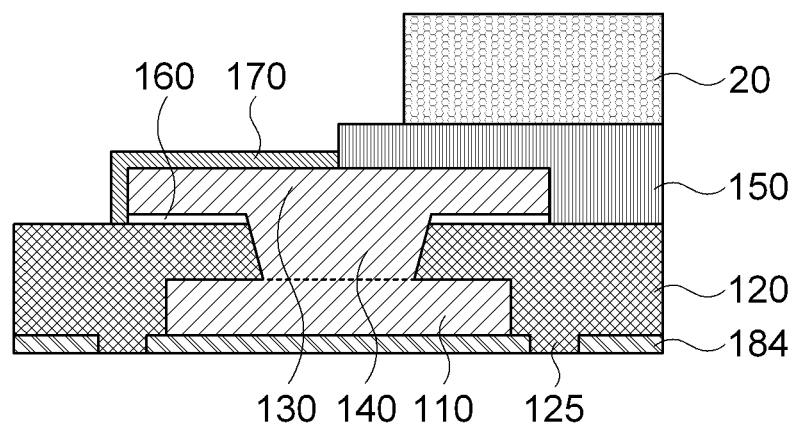
FIG. 19C
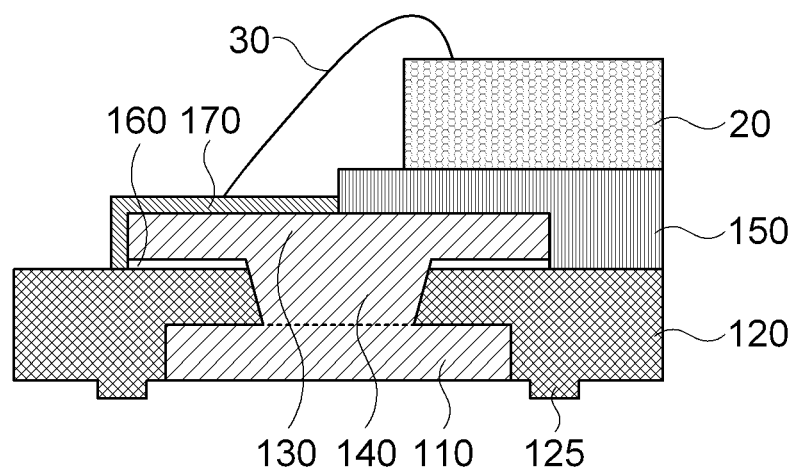

PRINTED CIRCUIT BOARD AND METHOD FOR MANUFACTURING THE SAME

CROSS-REFERENCE TO RELATED APPLICATIONS

This application claims the foreign priority benefit of Korean Patent Application No. 10-2012-0004406, filed Jan. 13, 2012 in the Korean Intellectual Property Office, the disclosure of which is hereby incorporated by reference in its entirety into this application.

BACKGROUND OF THE INVENTION

1. Field of the Invention

The present invention relates to a printed circuit board and a method for manufacturing the same.

2. Description of the Related Art

In recent times, miniaturization and technology integration of electronic devices and products have been steadily developed due to advance of the electronic devices and products. In addition, various changes in a manufacturing process of printed circuit boards used in the electronic devices and products are also needed in response to miniaturization and technology integration.

A technical direction for a method for manufacturing a printed circuit board has been developed from a single-sided printed circuit board to a double-sided printed circuit board at an early stage and to a multilayer printed circuit board again. Especially, recently, in manufacturing a multilayer printed circuit board, a manufacturing method, which is called a build-up method, is being developed.

Meanwhile, in a manufacturing process of printed circuit boards, a process of forming various via holes such as an inner via hole (IVH), a blind via hole (BVH), and a plated through hole (PTH) is needed to electrically connect between a circuit pattern and an electronic element of each layer. In the prior art, after forming a via hole in a base substrate, when plating is performed on upper and lower surfaces of the base substrate including an inner surface of the via hole and plating for interlayer electrical connection is completed, circuit patterns including pads are formed on the upper and lower surfaces of the base substrate so that solder balls or bumps are mounted on the pads.

However, when manufacturing a printed circuit board in accordance with the prior art, it is difficult to stably mount the solder ball due to limitation on bonding strength between the solder ball and the pad. That is, the bonding strength between the solder ball and the pad is affected by a step between the pad and a resist formed on the pad. When the step between the pad and the resist is small, the bonding strength between the solder ball and the pad is reduced. On the contrary, when the step between the pad and the resist is large, since a thickness of the printed circuit board is increased, it is difficult to respond to a demand for high density and thinning of the printed circuit board.

Due to this, there is a problem of degradation of reliability of the entire product having the printed circuit board.

SUMMARY OF THE INVENTION

The present invention has been invented in order to overcome the above-described problems and it is, therefore, an object of the present invention to provide a printed circuit board capable of stably mounting a solder ball by forming a protrusion in a region adjacent to a pad on which the solder ball is mounted, and a method for manufacturing the same.

In accordance with one aspect of the present invention to achieve the object, there is provided a printed circuit board including: a solder pad on which a solder ball is mounted; an insulator formed on the solder pad; and a protrusion formed under the insulator to support the solder ball when mounting the solder ball.

The protrusion may be formed in a region adjacent to the solder pad.

The protrusion may be formed to surround the entire solder pad.

A plurality of protrusions may be formed to be spaced apart from each other to surround the entire solder pad.

The protrusion may be formed integrally with the insulator.

The protrusion may have a height corresponding to a size of the solder ball.

The printed circuit board may further include a connection pad formed on the insulator; a via penetrating the insulator to electrically connect the solder pad and the connection pad; and a resist formed on the insulator and having an opening to expose the connection pad.

The printed circuit board may further include a surface treatment layer formed on the exposed connection pad.

The connection pad may be a bump-forming pad for forming a bump.

The connection pad may be a wire-bonding pad for mounting an electronic element.

Meanwhile, in accordance with another aspect of the present invention to achieve the object, there is provided a method for manufacturing a printed circuit board including the steps of: forming a solder pad on which a solder ball is mounted; forming an insulator on the solder pad; and forming a protrusion in the insulator to support the solder ball when mounting the solder ball.

The step of forming the solder pad may include the steps of: manufacturing a carrier by forming a resin and a first metal layer on at least one surface of the resin; forming an open region corresponding to the protrusion in the first metal layer; disposing a first film layer having an open region corresponding to the solder pad on the first metal layer; filling metal in the open region corresponding to the solder pad; and removing the first film layer.

The method for manufacturing a printed circuit board may further include, after the step of forming the insulator, the steps of: removing the resin of the carrier; and forming the protrusion by removing the first metal layer.

The method for manufacturing a printed circuit board may further include, after the step of forming the insulator on the solder pad, the steps of: processing a via hole in the insulator; forming a via by filling metal in the via hole; and forming a connection pad electrically connected to the solder pad through the via.

The carrier may further include a release film formed between the resin and the first metal layer.

The method for manufacturing a printed circuit board may further include, after the step of forming the insulator on the solder pad, the steps of: processing a via hole to form a via in the insulator; disposing a second film layer, which has an open region corresponding to a connection pad electrically connected to the solder pad through the via, on the insulator; filling metal in the via hole and the open region corresponding to the connection pad; and removing the second film layer.

The method for manufacturing a printed circuit board may further include, before the step of removing the resin of the carrier, the steps of: forming a resist having an opening to expose the connection pad on the insulator; and forming a surface treatment layer on the exposed connection pad.

The method for manufacturing a printed circuit board may further include, after the step of forming the insulator on the solder pad, the step of forming a second metal layer on the insulator, and after forming the connection pad, the step of removing the second metal layer formed on a surface of the insulator.

The protrusion may be formed in a region adjacent to the solder pad.

The protrusion may be formed to surround the entire solder pad.

A plurality of protrusions may be formed to be spaced apart from each other to surround the entire solder pad.

The protrusion may be formed integrally with the insulator.

The protrusion may have a height corresponding to a size of the solder ball.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 4 to 17 are cross-sectional views showing a process of manufacturing a printed circuit board in accordance with an embodiment of the present invention, wherein FIG. 4 is a cross-sectional view of a carrier, FIG. 5 is a cross-sectional view of a first metal layer having an open region corresponding to a protrusion, FIG. 6 is a cross-sectional view showing a state in which a first film layer having an open region corresponding to a solder pad is disposed on the carrier, FIG. 7 is a cross-sectional view showing a state in which metal is filled in the open region corresponding to the solder pad, FIG. 8 is a cross-sectional view showing a state in which the first film layer is removed, FIG. 9 is a cross-sectional view showing a state in which an insulator and a second metal layer are formed on the carrier, FIG. 10 is a cross-sectional view showing a state in which a via hole is formed in the insulator and the second metal layer, FIG. 11 is a cross-sectional view showing a state in which a second film layer having an open region corresponding to a via and a connection pad is disposed on the second metal layer, FIG. 12 is a cross-sectional view showing a state in which metal is filled in the open region corresponding to the via and the connection pad, FIG. 13 is a cross-sectional view showing a state in which the second film layer is removed, FIG. 14 is a cross-sectional view showing a state in which the second metal layer formed on a surface of the insulator is removed, FIG. 15 is a cross-sectional view showing a state in which a resist is formed on the insulator and a surface treatment is performed, FIG. 16 is a cross-sectional view showing a state in which a resin of the carrier is removed, and FIG. 17 is a cross-sectional view showing a state in which a protrusion is formed by removing the first metal layer;

FIG. 18a is a cross-sectional view of a printed circuit board in which a first metal layer is formed under an insulator, FIG. 18b is a cross-sectional view showing a state in which a die is attached to the printed circuit board, FIG. 18c is a cross-sectional view showing a state in which a wire is bonded, FIG. 18d is a cross-sectional view showing a state in which an upper surface of the printed circuit board is molded with epoxy, FIG. 18e is a cross-sectional view showing a state in which the first metal layer in a lower portion of the printed circuit board is removed, and FIG. 18f is a cross-sectional view showing a state in which a solder ball is mounted on a solder pad; and FIGS. 19a to 19e are cross-sectional views showing a process of assembling a printed circuit board in accordance with another embodiment of the present invention, wherein FIG. 19a is a cross-sectional view of the printed circuit board in which a first metal layer under an insulator is removed, FIG. 19b is a cross-sectional view showing a state in which a die is attached to the printed circuit board, FIG. 19c is a cross-sectional view showing a state in which a wire is bonded, FIG. 19d is a cross-sectional view showing a state in which an upper surface of the printed circuit board is molded with epoxy, and FIG. 19e is a cross-sectional view showing a state in which a solder ball is mounted on a solder pad.

DETAILED DESCRIPTION OF THE PREFERABLE EMBODIMENTS

The terms or words used in the present specification and claims should not be interpreted as being limited to typical or dictionary meanings, but should be interpreted as having meanings and concepts relevant to the technical spirit of the present invention based on the rule according to which an inventor can appropriately define the concept of the term to describe his/her own invention in the best manner.

Therefore, configurations shown in embodiments and the drawings of the present invention rather are examples of the most exemplary embodiment and do not represent all of the technical spirit of the invention. Thus, it will be understood that various equivalents and modifications that replace the configurations are possible when filing the present application.

Hereinafter, embodiments of the present invention will be described in detail with reference to the accompanying drawings.

Figure 1A:
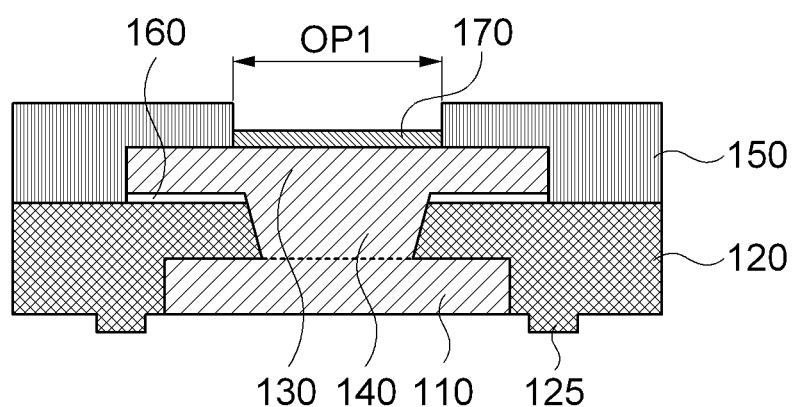
FIG. 1a is a cross-sectional view of a printed circuit board in accordance with an embodiment of the present invention.
Figure 1B:
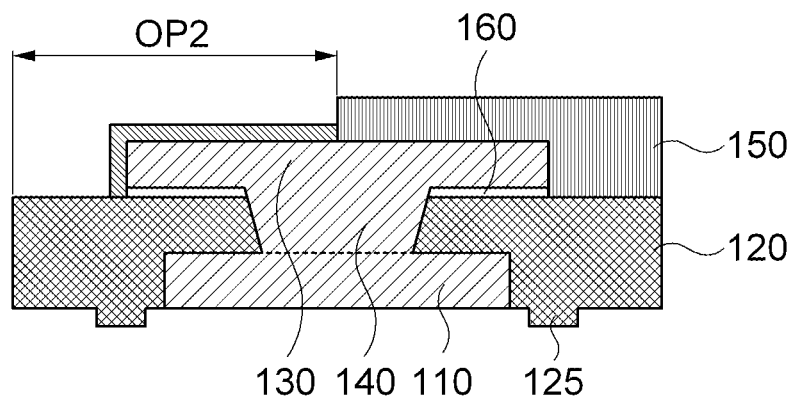
FIG. 1b is a cross-sectional view of a printed circuit board in accordance with another embodiment of the present invention.

FIG. 1a is a cross-sectional view of a printed circuit board in accordance with an embodiment of the present invention, and FIG. 1b is a cross-sectional view of a printed circuit board in accordance with another embodiment of the present invention.

As shown in FIGS. 1a and 1b, a printed circuit board 100 includes a solder pad 110, an insulator 120, a protrusion 125, a connection pad 130, a via 140, and a resist 150.

The solder pad 110 is a means on which a solder ball 50 is mounted and may be made of a metal material such as copper (Cu), silver (Ag), gold (Au), aluminum (Al), iron (Fe), titanium (Ti), tin (Sn), nickel (Ni), or molybdenum (Mo).

Here, configuration of the printed circuit board as in FIGS. 1a and 1b is only an example, the printed circuit board may be a single-sided printed circuit board, a both-sided printed circuit board, or a multilayer printed circuit board, and technical features of the present invention can be equally applied.

Further, the configuration of the printed circuit board as in FIGS. 1a and 1b can be applied to various package substrates including a wire-bonding substrate and a flip-chip bonding substrate.

The insulator 120 is a means of supporting the printed circuit board 100, formed on the solder pad 110, and may be made of various materials, which have low electrical conductivity and hardly pass current, such as prepreg, polyimide, polyethyelenetereptalate (PET), cyanide ester, Ajinomoto build-up film (ABF), and epoxy.

The protrusion 125 is formed under the insulator 120 and plays a role of supporting the solder ball 50 when mounting the solder ball 50. More specifically, in a structure in which the solder pad 110 is exposed under the insulator 120, it is possible to stably mount the solder ball 50 by forming the protrusion 125 in a region adjacent to the solder pad 110 to increase a contact area between the solder ball 50 and the solder pad 110.

At this time, the protrusion 125 may be formed integrally with the insulator 120. It is possible to simplify a process of manufacturing a printed circuit board compared to a process of separately forming the protrusion 125 by forming the protrusion 125 integrally with the insulator 120. Due to this, it is possible to reduce manufacturing costs.

Further, the protrusion 125 may have various heights according to a size of the solder ball 50. More specifically, when the size of the solder ball 50 is large, the protrusion 125 may be formed to have a height high enough to support the solder ball 50, and when the size of the solder ball 50 is small, the protrusion 125 may be formed to have a low height. At this time, it is possible to implement the protrusion 125 with various heights according to the size of the solder ball 50 by changing a design of an open region of a plating layer.

Figure 2A:
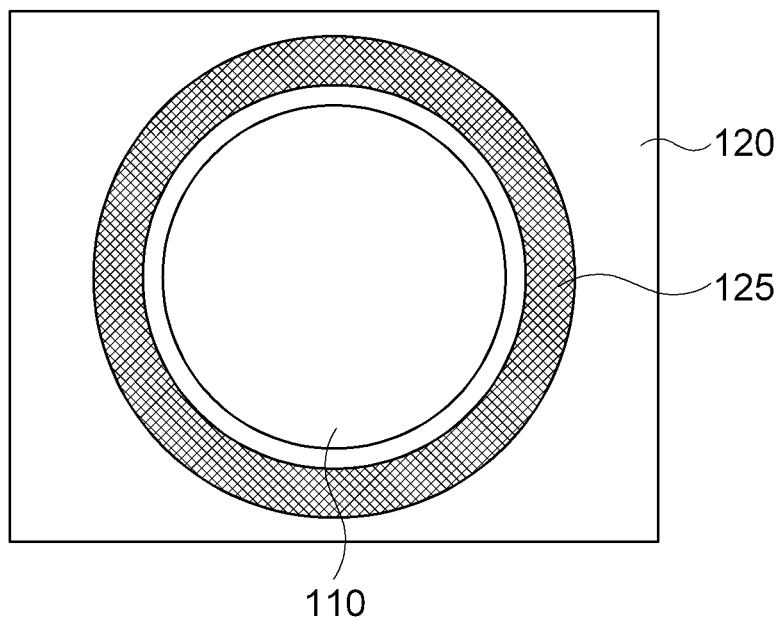
FIG. 2a is a plan view of a protrusion structure in accordance with an embodiment of the present invention.
Figure 2B:
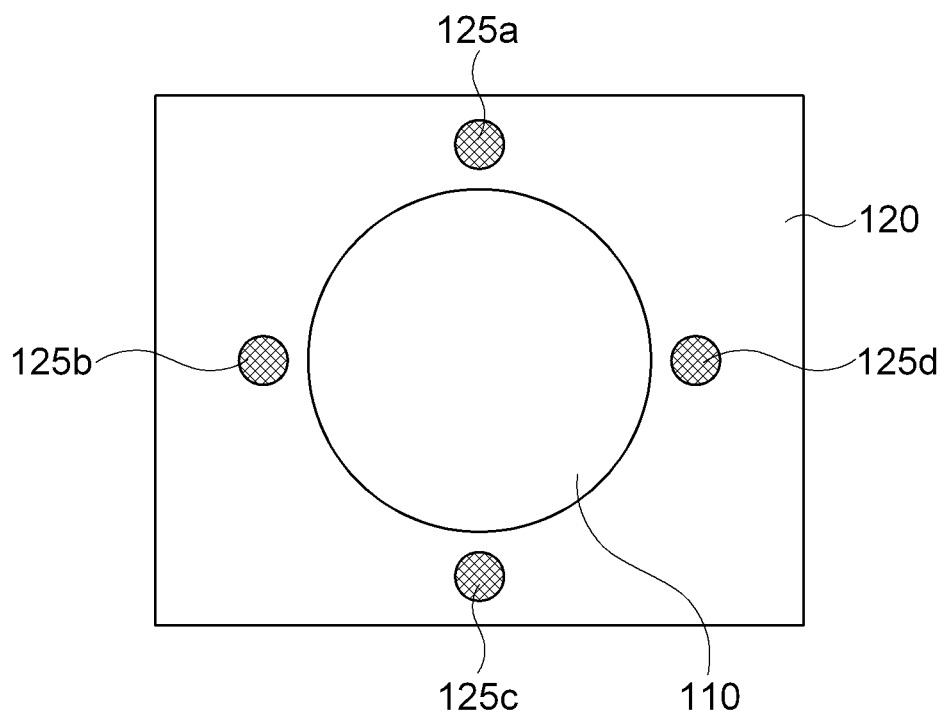
FIG. 2b is a plan view of a protrusion structure in accordance with another embodiment of the present invention.

FIG. 2a is a plan view of a protrusion structure in accordance with an embodiment of the present invention, and FIG. 2b is a plan view of a protrusion structure in accordance with another embodiment of the present invention. As shown in FIG. 2a, assuming that the solder pad 110 has a circular shape, the protrusion 125 may be formed in the shape of a donut with a larger diameter than the solder pad 110 to surround the entire solder pad 110.

Further, as in FIG. 2b, the protrusion 125 (125a to 125d) may have a structure in which a plurality of protrusions (for example, four) are spaced apart from each other to surround the entire solder pad 110. In addition, the protrusion 125 can be formed in various structures.

The connection pad 130 is formed on the insulator 120 and may be formed by various methods such as a subtractive method, an additive method, and a semi-additive method.

The via 140 penetrates the insulator 120 to electrically connect the solder pad 110 and the connection pad 130.

The resist 150 having an opening (OP) to expose the connection pad 130 is formed on the insulator 120. At this time, the resist 150 may consist of various photosensitive materials such as photo resist, solder resist, and dry film and can be replaced with various materials without being limited to the above materials.

At this time, solder resist is one of permanent insulating coating materials and means a film that covers a circuit pattern to prevent occurrence of unintended connection due to soldering performed when mounting an electronic element. Since the solder resist covers the circuit pattern and shields the pad required for the soldering of the electronic element, that is, the remaining portion except around the portion in which the electronic element is to be mounted, it is also called a solder mask, prevents short, corrosion, and contamination of a printed circuit board, and remains as a film on the printed circuit board after manufacture of the printed circuit board to protect a circuit from external impact, moisture, and chemical materials.

As in FIG. 1a, when an opening (OP1) is formed in the resist 150 to expose an upper surface of the connection pad 130, the connection pad 130 may be a bump-forming pad for forming a bump, and as in FIG. 1b, when an opening (OP2) is formed in the resist 150 to expose the upper surface and one side surface of the connection pad 130, the connection pad 130 may be a wire-bonding pad for mounting an electronic element.

Meanwhile, the printed circuit board 100 in accordance with embodiments of the present invention may further include a second metal layer 160 and a surface treatment layer 170.

The second metal layer 160 is formed between the insulator 120 and the connection pad 130 and may be made of copper (Cu), silver (Ag), gold (Au), aluminum (Al), iron (Fe), titanium (Ti), tin (Sn), nickel (Ni), or molybdenum (Mo).

At this time, the second metal layer 160 may include a typical metal layer, a plated metal layer, or a sputtered metal layer.

The surface treatment layer 170 is a metal film made of nickel or gold, which is formed by treating the surface of the connection pad 130 exposed to the opening (OP), and may be formed by an electroless nickel immersion gold (ENIG) method or an electroless nickel electroless palladium immersion gold (ENEPIG) method which is an environmentally-friendly and low-cost surface treatment method.

Here, the ENEPIG method is electroless plating which forms a three-layer structure of electroless nickel/electroless palladium/immersion gold and an electroless version of Pd-Pre-plated-Frame (PPF) plating of a lead frame. And, since it is possible to suppress thermal diffusion of nickel by inserting a palladium layer between a nickel layer and a gold layer, the ENEPIG method can improve soldering bonding strength compared to the ENIG method and is suitable for a flip-chip BGA which requires high soldering bonding strength while being disadvantageous in terms of price compared to the ENIG method.

Figure 3:
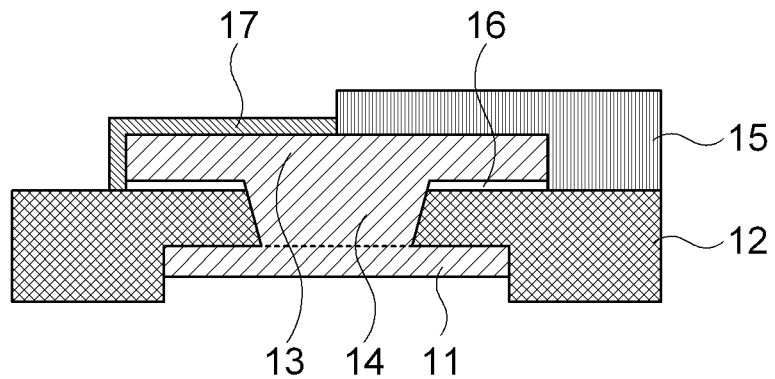
FIG. 3 is a cross-sectional view of a printed circuit board without a protrusion.

FIG. 3 is a cross-sectional view of a printed circuit board without a protrusion. When describing a printed circuit board in accordance with an embodiment of the present invention with reference to FIG. 3, as in FIG. 3, in case of a printed circuit board without a protrusion, since a step should be formed by removing a first metal layer under an insulator 12 simultaneously with selectively removing a lower portion of a solder pad 11, it is difficult to set etching (removal) conditions of the solder pad 11.

That is, when the solder pad 11 is slightly etched, since a mounting space of a solder ball is reduced, a contact area between the solder ball and the solder pad 11 is reduced, thus causing degradation of bonding reliability of the solder ball. When the solder pad 11 is etched much, a thickness of the solder pad 11 is reduced.

On the contrary, in the printed circuit board in accordance with embodiments of the present invention shown in FIGS. 1a and 1b, since the protrusion 125 is formed in the region adjacent to the solder pad 110 in the structure in which the solder pad 110 is exposed under the insulator 120, it is possible to stably mount the solder ball 50 by increasing the contact area between the solder ball 50 and the solder pad 110 without etching conditions.

Hereinafter, a process of manufacturing a printed circuit board in accordance with an embodiment of the present invention will be described.

FIGS. 4 to 17 are cross-sectional views showing a process of manufacturing a printed circuit board in accordance with an embodiment of the present invention.

Figure 4:
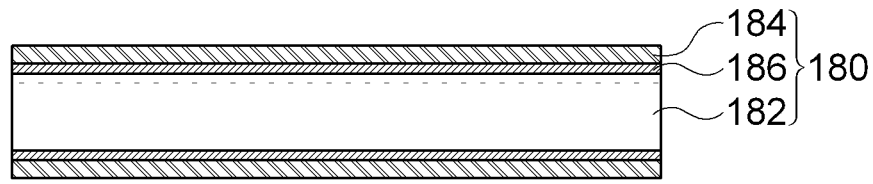

As shown in FIG. 4, a carrier 180 is manufactured by forming a resin 182 and a first metal layer 184 on at least one surface of the resin 182. At this time, in the carrier 180, a release film 186 may be further formed between the resin 182 and the first metal layer 184 to easily separate a printed circuit board 100.

At this time, the resin 182 is an amorphous solid or a semi-solid consisting of organic compounds and derivatives thereof and may consist of synthetic resins such as plastic. The above carrier 180 may be made of various materials such as insulating materials, which have low electric conductivity and hardly pass current, instead of the resin 182.

Further, one of a sputtering method, an attaching method, and a plating method may be used to form the first metal layer 184 on the at least one surface of the resin 182. Among them, the sputtering method is a technology of attaching a film to a surface of an object and can be used when forming a thin film or a thick film by evaporating a solid in a high vacuum state to form an electronic circuit in a ceramic or semiconductor material.

Meanwhile, in FIGS. 4 to 16, although the process of manufacturing the printed circuit boards on upper and lower surfaces of the carrier is described, the printed circuit board can be manufactured on one surface of the carrier and technical features of the present invention can be equally applied.

Figure 5:
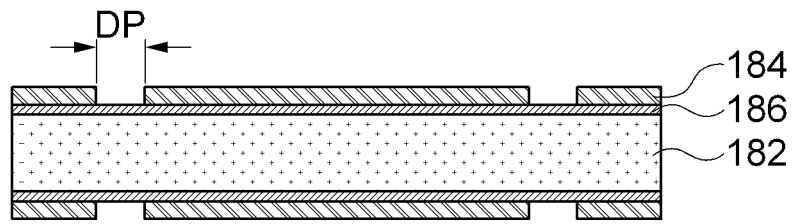

Next, as in FIG. 5, an open region (DP) corresponding to a protrusion 125 is formed in the first metal layer 184.

Figure 6:
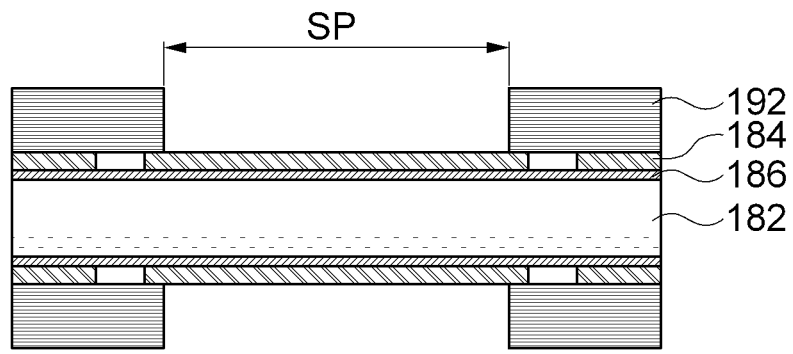

After that, as in FIG. 6, a first film layer 192 having an open region (SP) corresponding to a solder pad 110 is disposed on the first metal layer 184. At this time, the first film layer 192 may be made of various photosensitive materials such as photo resist, solder resist, and dry film and can be replaced with various materials without being limited to the above materials.

Figure 7:
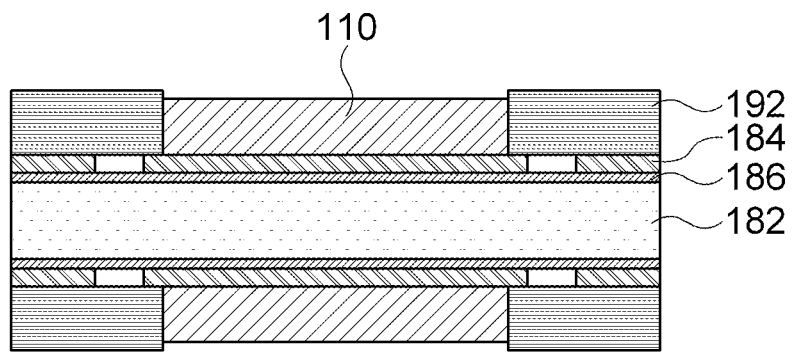
Figure 8:
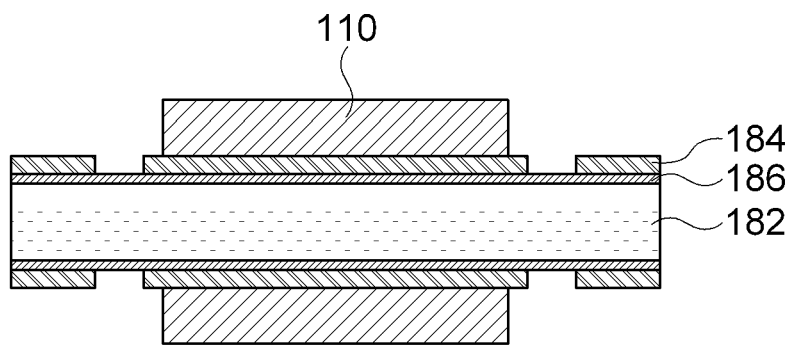

As in FIGS. 7 and 8, after filling metal in the open region (SP) corresponding to the solder pad 110, the solder pad 110 is formed by removing the first film layer 192. At this time, the metal may be copper (Cu), silver (Ag), gold (Au), aluminum (Al), iron (Fe), titanium (Ti), tin (Sn), nickel (Ni), or molybdenum (Mo).

Figure 9:
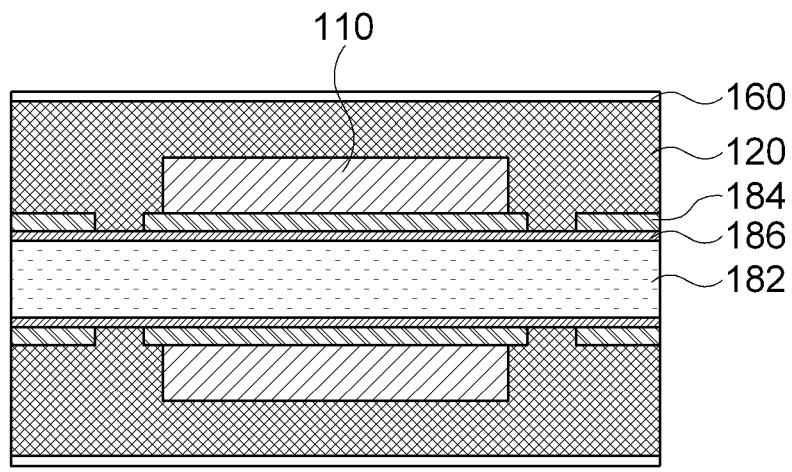
Figure 10:
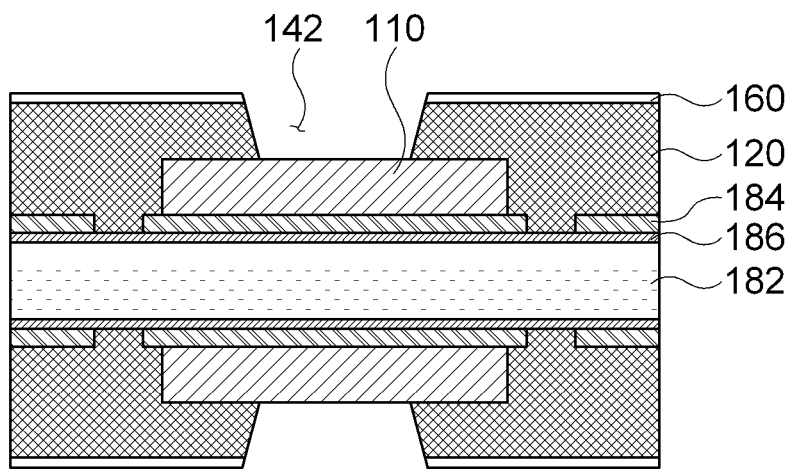

As shown in FIG. 9, after sequentially forming an insulator 120 and a second metal layer 160 on the carrier 180 including the solder pad 110, as in FIG. 10, a via hole 142 for forming a via 140 is processed in the insulator 120. At this time, the via hole 142 with a desired diameter can be formed in the insulator 120 by using various drills such as a computer numerical control (CNC) drill or an X-ray drill in addition to various lasers such as ultraviolet (UV) laser or carbon dioxide ($CO_2$) laser.

Figure 11:
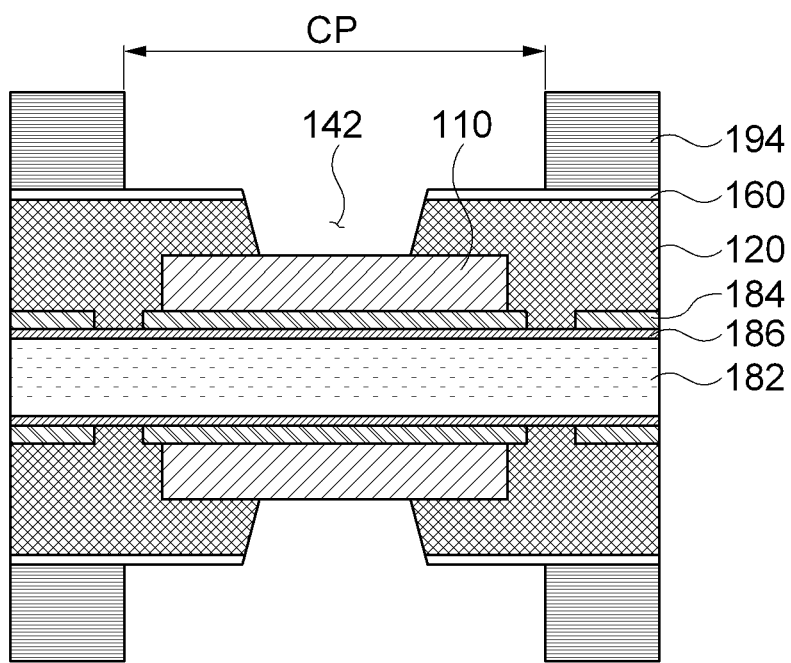
Figure 12:
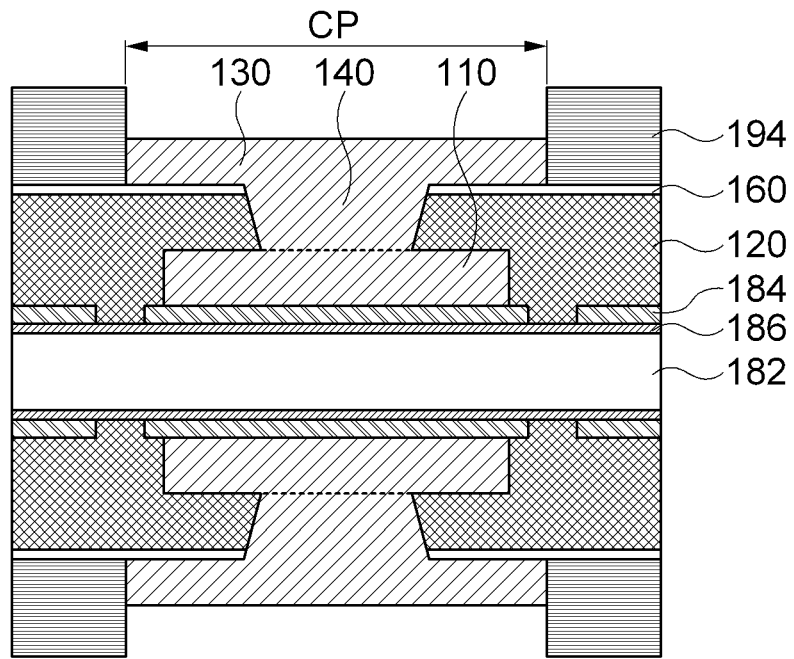
Figure 13:
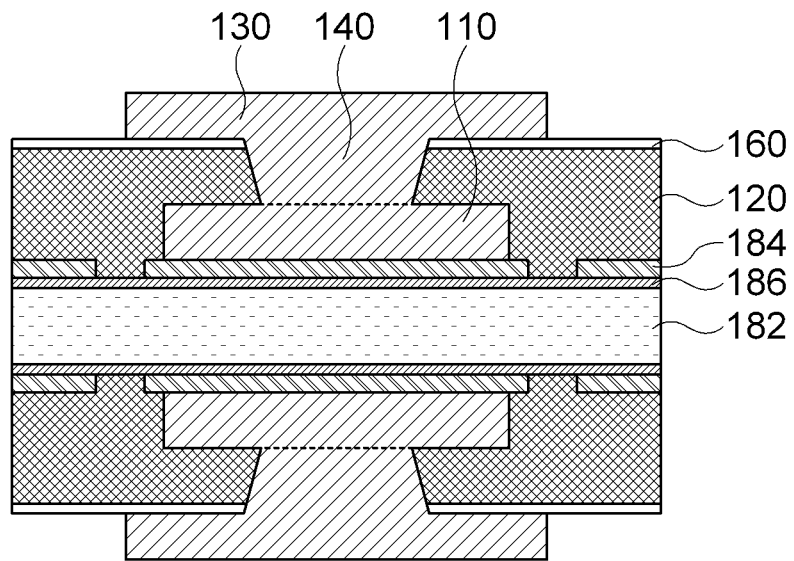

Next, as in FIG. 11, a second film layer 194 having an open region (CP) corresponding to a connection pad 130 electrically connected to the solder pad 110 through the via 140 is disposed on the insulator 120, and as in FIGS. 12 and 13, after filling metal in the via hole 142 and the open region (CP) corresponding to the connection pad 130, the via 140 and the connection pad 130 are formed by removing the second film layer 194.

Figure 14:
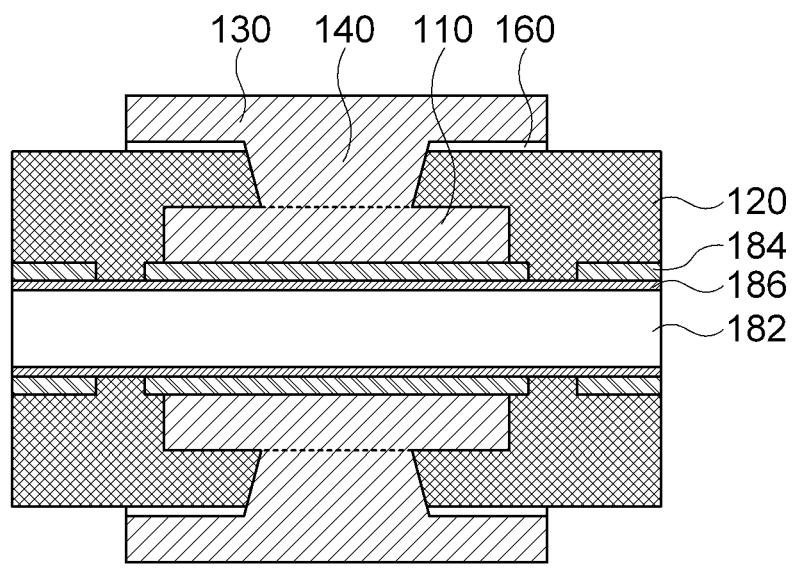

And, as in FIG. 14, a second metal layer 160 formed on a surface of the insulator 120 is removed.

Figure 15:
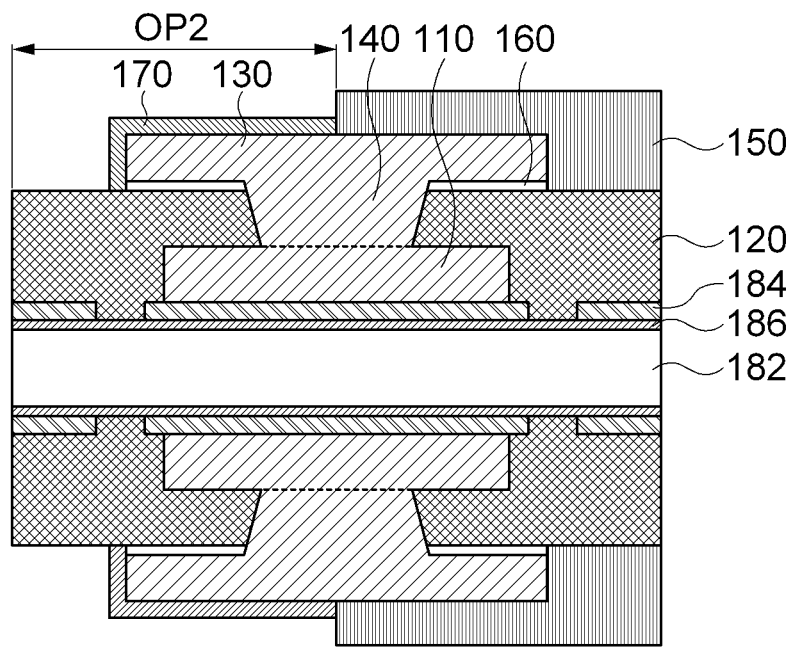

Next, as in FIG. 15, a resist 150 having an opening (OP2) to expose the connection pad 130 is formed on the insulator 120, and a surface treatment layer 170 is formed on the exposed connection pad 130.

Figure 16:
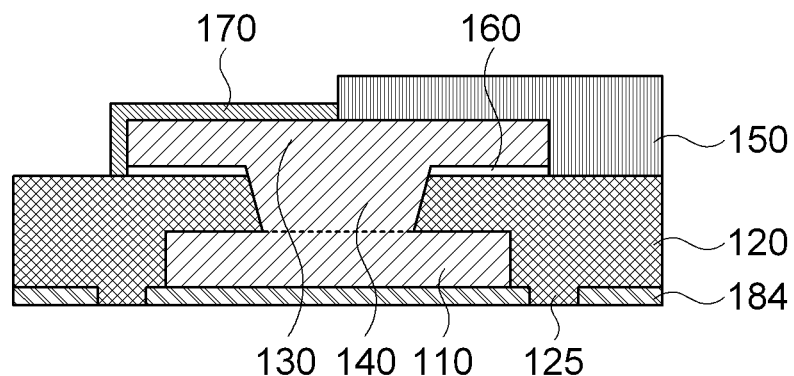
Figure 17:
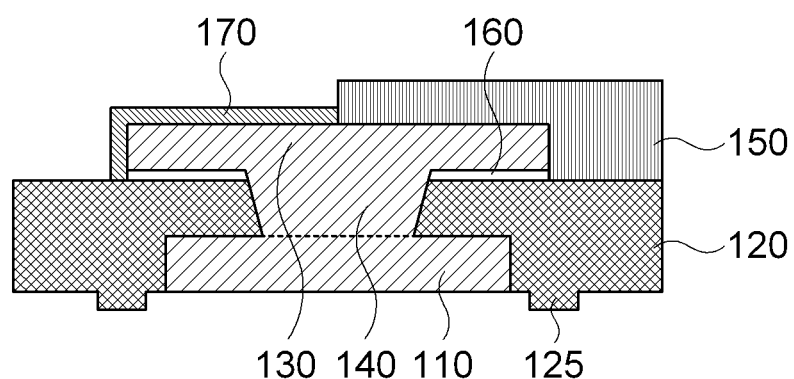

Next, when removing the resin 182 of the carrier 180, as in FIG. 16, the printed circuit board in which the first metal layer 184 is formed under the insulator 120 is formed, and when removing the first metal layer 184 under the insulator 120, as in FIG. 17, the protrusion 125 is formed under the insulator 120 of the printed circuit board 100 to perform a role of supporting a solder ball 50 when mounting the solder ball 50.

FIGS. 18a to 18f are cross-sectional views showing a process of assembling a printed circuit board in accordance with an embodiment of the present invention.

Figure 18A:
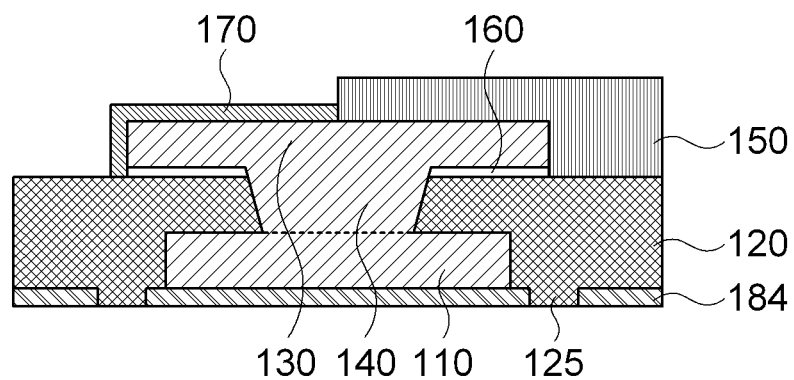
FIGS. 18a to 18f are cross-sectional views showing a process of assembling a printed circuit board in accordance with an embodiment of the present invention.

FIG. 18a is a cross-sectional view of a printed circuit board in which a first metal layer 184 is formed under an insulator 120 and shows a process of removing the first metal layer 184 formed under the insulator 120 through etching after performing epoxy molding compound (EMC) molding and curing processes in the process of assembling the printed circuit board.

Figure 18B:
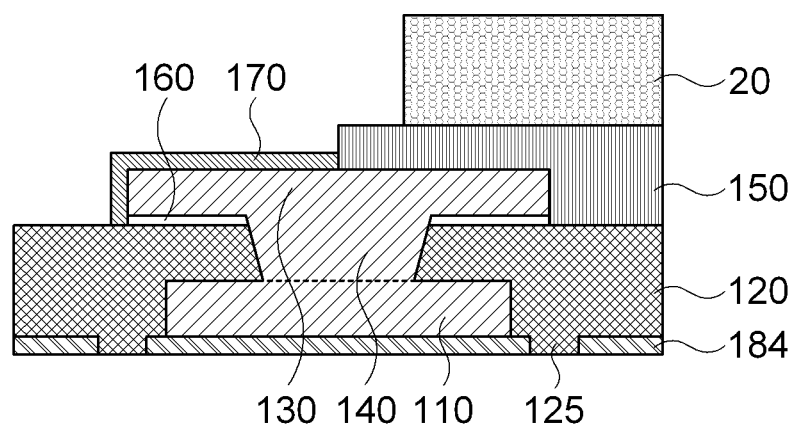
Figure 18C:
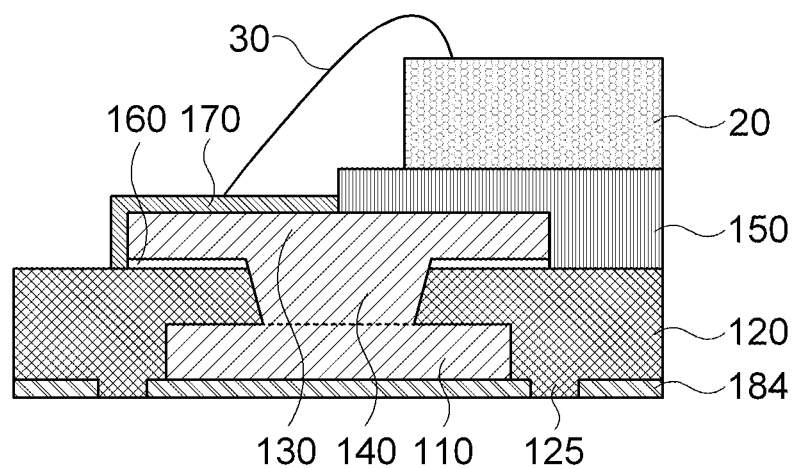

As in FIG. 18b, a die 20 is attached to the printed circuit board and bonded by a wire 30 as in FIG. 18c.

Figure 18D:
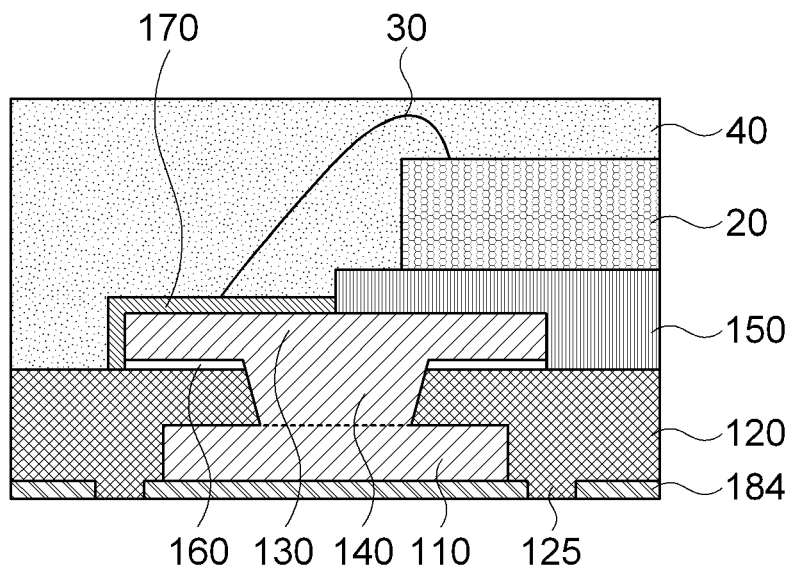
Figure 18E:
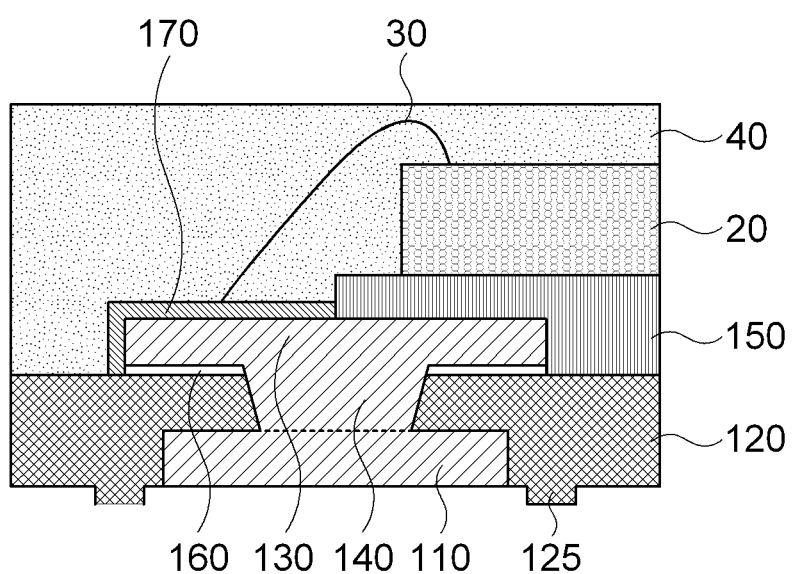
Figure 18F:
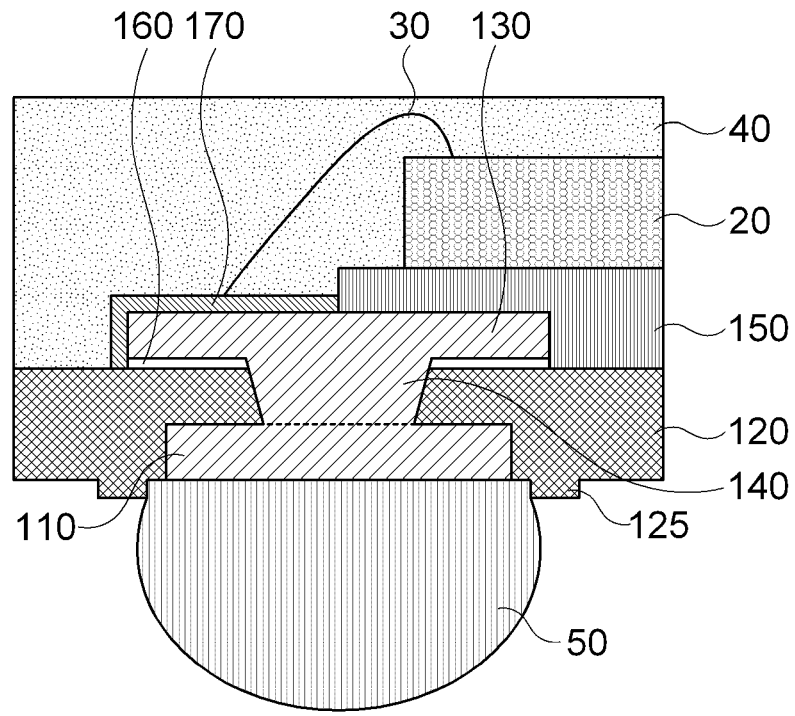

And, as in FIG. 18d, an upper surface of the printed circuit board is molded with epoxy 40, and as in FIGS. 18e and 18f, a solder ball 50 is mounted on a solder pad 110 after forming a protrusion 125 by removing the first metal layer 184 in a lower portion of the printed circuit board.

Like this, after removing the first metal layer 184, the solder pad 110 on which the solder ball is to be mounted is exposed and the protrusion 125 is formed around the solder pad 110. At this time, the protrusion 125 is determined by a circuit process design of the first step in the process of manufacturing the printed circuit board.

If the printed circuit board is a thin substrate, since it may be difficult to drive the printed circuit board because of warpage or damage of the printed circuit board during the processes of manufacturing and assembling the printed circuit board, as in FIGS. 18a to 18f, the process of assembling the printed circuit board can be performed in a state in which the first metal layer 184 under the insulator 120 is maintained. This is because there is no risk of warpage or damage of the printed circuit board after the molding process.

FIGS. 19a to 19e are cross-sectional views showing a process of assembling a printed circuit board in accordance with another embodiment of the present invention.

Figure 19A:
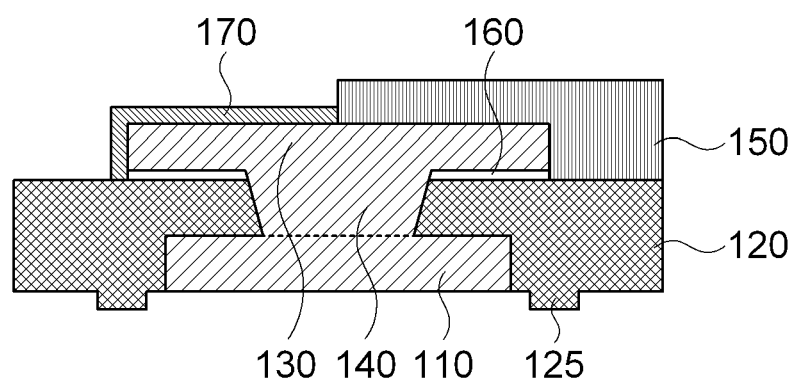

FIG. 19a is a cross-sectional view of a printed circuit board in which a first metal layer under an insulator is removed and shows a process of assembling the printed circuit board in a state in which the first metal layer 184 formed under the insulator 120 is removed by an etching process.

And, as in FIG. 19b, a die 20 is attached to the printed circuit board, and as in FIG. 19c, a wire 30 is bonded.

Figure 19D:
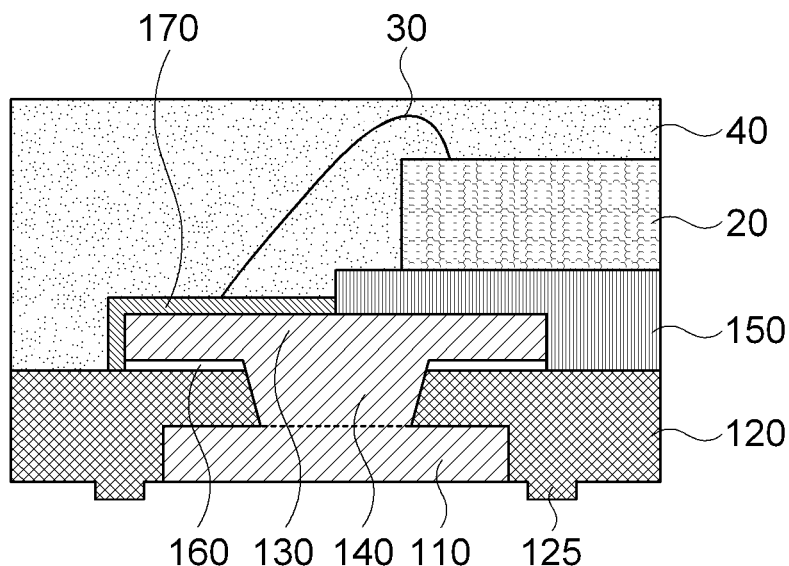
Figure 19E:
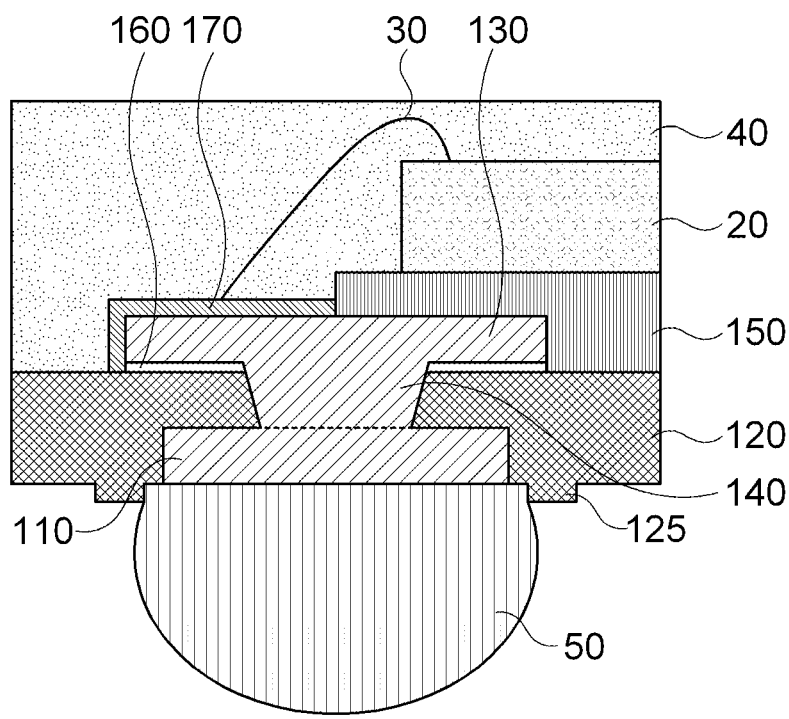

After that, as in FIG. 19d, an upper surface of the printed circuit board is molded with epoxy, and as in FIG. 19e, a solder ball 50 is mounted on a solder pad 110.

Like this, the method shown in FIGS. 19a to 19e is a method that can be applied when there is no risk of warpage of the printed circuit board or there is a difficulty in adding a separate etching process in the process of assembling the printed circuit board.

As described above, according to the printed circuit board and the method for manufacturing the same in accordance with an embodiment of the present invention, it is possible to stably mount the solder ball by forming the protrusion in the region adjacent to the pad on which the solder ball is mounted. That is, it is possible to improve bonding reliability of the solder ball by uniformly maintaining the contact area between the solder ball and the pad.

Further, it is possible to reduce manufacturing costs of the printed circuit board by forming the protrusion in the region adjacent to the pad on which the solder ball is mounted together when forming the insulator during manufacture of the printed circuit board.

In addition, it is possible to equally apply the structure of forming the protrusion to various types of printed circuit boards.

Due to this, it is possible to improve reliability of the entire product having the printed circuit board.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A printed circuit board comprising:
    a solder pad having a first surface on which a solder ball is mounted;
    an insulator formed on surfaces of the solder pad except the first surface and having a lower surface disposed on a same plane as the first surface of the solder pad; and
    a protrusion formed under the insulator to support the solder ball when mounting the solder ball.

2. The printed circuit board according to claim 1, wherein the protrusion is laterally distanced from a boundary between the first surface of the solder pad and the lower surface of the insulator by a predetermined distance, and the protrusion is protruded from the lower surface of the insulator.

3. The printed circuit board according to claim 1, wherein the protrusion is formed to surround the entire solder pad.

4. The printed circuit board according to claim 1, wherein a plurality of protrusions are formed to be spaced apart from each other to surround the entire solder pad.

5. The printed circuit board according to claim 1, wherein the protrusion is formed integrally with the insulator.

6. The printed circuit board according to claim 1, wherein the protrusion has a height corresponding to a size of the solder ball.

7. The printed circuit board according to claim 1, further comprising:
    a connection pad formed on the insulator;
    a via penetrating the insulator to electrically connect the solder pad and the connection pad; and
    a resist formed on the insulator and having an opening to expose the connection pad.

8. The printed circuit board according to claim 7, further comprising:
    a surface treatment layer formed on the exposed connection pad.

9. The printed circuit board according to claim 7, wherein the connection pad is a bump-forming pad for forming a bump.

10. The printed circuit board according to claim 7, wherein the connection pad is a wire-bonding pad for mounting an electronic element.

11. A method for manufacturing a printed circuit board comprising:
    forming a solder pad on a first metal layer, the first metal layer having an open region;
    forming an insulator on the solder pad and on the first metal layer such that a portion of the insulator is placed in the open region of the first metal layer, thereby forming a protrusion in the insulator, formed from the portion of the insulator placed in the open region, that supports a solder ball when mounting the solder ball on the solder pad; and
    after the forming the insulator and the protrusion, removing the first metal layer.

12. The method for manufacturing a printed circuit board according to claim 11, further comprising, after forming the insulator on the solder pad,
    processing a via hole in the insulator;
    forming a via by filling metal in the via hole; and
    forming a connection pad electrically connected to the solder pad through the via.

13. The method for manufacturing a printed circuit board according to claim 12, further comprising
    forming a resist having an opening to expose the connection pad on the insulator; and
    forming a surface treatment layer on the exposed connection pad.

14. The method for manufacturing a printed circuit board according to claim 12, further comprising, after forming the insulator on the solder pad,
    forming a second metal layer on the insulator, and after forming the connection pad, removing the second metal layer formed on a surface of the insulator.

15. The method for manufacturing a printed circuit board according to claim 11, further comprising, after forming the insulator on the solder pad,
    processing a via hole to form a via in the insulator;
    disposing a second film layer, which has an opening part corresponding to a connection pad electrically connected to the solder pad through the via, on the insulator;
    filling metal in the via hole and the opening part corresponding to the connection pad; and
    removing the second film layer.

16. The method for manufacturing a printed circuit board according to claim 11, wherein the protrusion is laterally distanced from a boundary between the first surface of the solder pad and the lower surface of the insulator by a predetermined distance, and the protrusion is protruded from the lower surface of the insulator.

17. The method for manufacturing a printed circuit board according to claim 11, wherein the protrusion is formed to surround the entire solder pad.

18. The method for manufacturing a printed circuit board according to claim 11, wherein a plurality of protrusions are formed to be spaced apart from each other to surround the entire solder pad.

19. The method for manufacturing a printed circuit board according to claim 11, wherein the protrusion is formed integrally with the insulator.

20. The method for manufacturing a printed circuit board according to claim 11, wherein the protrusion has a height corresponding to a size of the solder ball.

* * * * *